United States Patent
Li et al.

(10) Patent No.: US 12,267,957 B2
(45) Date of Patent: Apr. 1, 2025

(54) HYBRID PITCH THROUGH HOLE CONNECTOR

(71) Applicant: Intel Corporation, Santa Clara, CA (US)

(72) Inventors: Xiang Li, Portland, OR (US); George Vergis, Portland, OR (US); Jeffrey Krieger, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 955 days.

(21) Appl. No.: 17/127,829

(22) Filed: Dec. 18, 2020

(65) Prior Publication Data

US 2021/0153351 A1    May 20, 2021

(51) Int. Cl.
| | |
|---|---|
| *H05K 1/11* | (2006.01) |
| *G11C 5/06* | (2006.01) |
| *H01R 12/52* | (2011.01) |
| *H01R 12/72* | (2011.01) |

(52) U.S. Cl.
CPC ............ *H05K 1/115* (2013.01); *G11C 5/06* (2013.01); *H01R 12/523* (2013.01); *H01R 12/72* (2013.01)

(58) Field of Classification Search
None
See application file for complete search history.

(56) References Cited

U.S. PATENT DOCUMENTS

| | | | |
|---|---|---|---|
| 2003/0123236 A1* | 7/2003 | McGrath | H01R 13/6585 361/760 |
| 2006/0232301 A1* | 10/2006 | Morlion | H05K 1/114 326/126 |
| 2009/0011644 A1* | 1/2009 | Amleshi | H01R 12/724 439/607.05 |
| 2018/0276176 A1 | 9/2018 | Wig et al. | |
| 2019/0350079 A1 | 11/2019 | Chen | |
| 2020/0083645 A1 | 3/2020 | Lee et al. | |
| 2021/0159642 A1* | 5/2021 | Yang | H01R 13/6471 |

OTHER PUBLICATIONS

European Office Action, (EP Exam Report Article 94(3) EPC), for Patent Application No. 21198640.1, Mailed Dec. 20, 2023, 5 pages.
Extended European Search Report for Patent Application No. 21198640.1, Mailed Mar. 14, 2022, 10 pages.

* cited by examiner

*Primary Examiner* — Oscar C Jimenez
(74) *Attorney, Agent, or Firm* — Compass IP Law PC

(57) ABSTRACT

Connectors with a hybrid pitch are described. In one example, a connector to couple a card or module to a motherboard includes connector housing and a plurality of pins. The plurality of pins include alternating signal and ground pins. Each of the plurality of pins includes a card or module-facing end to couple with the card or module and a lead to couple with a through hole in the motherboard. A first pitch between leads of a pin and a first adjacent pin is different than a second pitch between leads of the pin and a second adjacent pin.

17 Claims, 5 Drawing Sheets

HYBRID PITCH THROUGH HOLE CONNECTOR

FIELD

The descriptions are generally related to connectors for coupling modules (such as memory modules) or devices with a printed circuit board such as a mother board, and more particularly, to connectors with a hybrid pin pitch for coupling with through holes on a mother board.

BACKGROUND

Various technologies exist for connecting cards and modules with a printed circuit board (PCB) such as a motherboard. It is possible to couple electronic components directly to a motherboard, however, it is common to use a connector between the motherboard and the card or module to enable removably coupling the card or module with the motherboard.

One technique for coupling a connector with a PCB is surface-mount technology (SMT). Surface-mount technology involves coupling the connector or other component directly to the surface of the PCB. Conductive contacts on both the connector and the motherboard are physically and electrically coupled, such as by soldering. Surface-mount technology is popular because it is typically deemed to have better performance than alternative techniques such as through hole connectors. However, SMT connectors can have reliability issues and can be expensive compared to connectors using through hole technology.

Through hole technology is another technique for coupling components to a PCB. In through hole technology, there are holes or vias in the PCB, and the component to be coupled with the PCB has conductive leads that pass through the holes in the PCB rather than contacts that are coupled with the surface of the PCB. Although through hole connectors are typically more reliable and lower cost than SMT connectors, there is a performance gap between SMT connectors and through hole connectors.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

Through hole connectors with a hybrid pitch can enable improved performance compared to conventional through hole connectors.

Conventional through hole connectors tend to have more crosstalk than surface mount connectors due to the through hole via effect. Due to the performance degradation of the though hole connector, surface mount connectors have often been favored as a solution over through hole connectors.

As described below, a through hole connector with a hybrid pitch can achieve similar performance to a surface mount connector. In one example, a through-hole connector to couple a card or module to a motherboard includes a plurality of pins including alternating signal and ground pins. Each of the plurality of pins including a card or module-facing end to couple with the card or module and a lead to couple with a through hole in the motherboard. The leads of the connector pins have a hybrid pitch. For example, the connector pins have a first pitch between leads of a pin and a first adjacent pin that is different than a second pitch between leads of the pin and a second adjacent pin. For example, leads of a signal pin and a first adjacent ground pin have the first pitch and leads of the signal pin and a second adjacent ground pin have the second pitch.

Figure 1A:
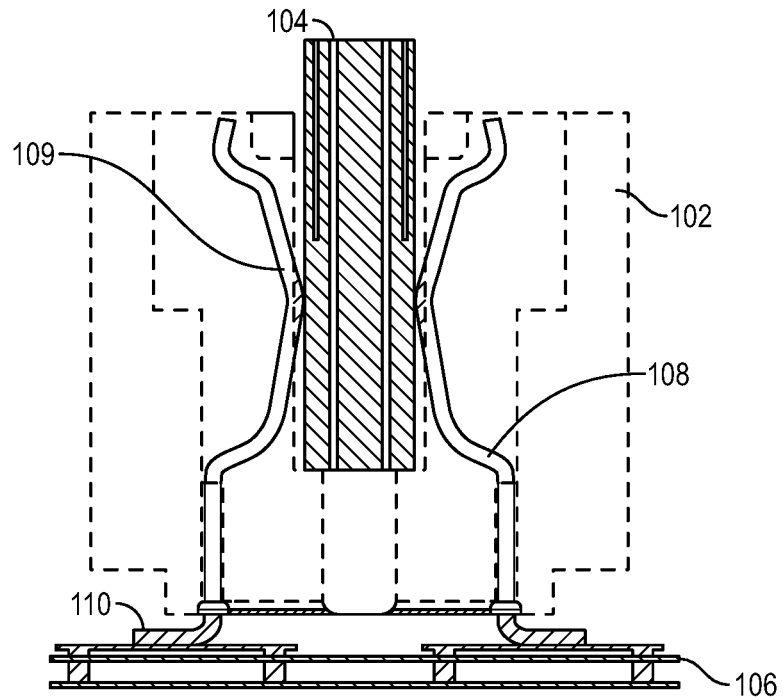
FIG. 1A is a cross-sectional view of an example of a module coupled with a motherboard via a surface-mounted connector.

FIG. 1A is a cross-sectional view of an example of a module coupled with a motherboard via a surface-mounted connector. A connector 102 includes pins 108 inside a connector housing. The pins include a bottom portion 110 external to the housing that is in physical and electrical contact with a contact (e.g., solder pad) on the surface of the motherboard 106. The connector 102 is typically mounted to the surface of the motherboard 106 by soldering the bottom portion 110 of the pins 108 with the pads on the surface of the motherboard 106. The pins also include a top portion 109 that couples with a contact on the surface of the module 104. Conductive contacts can include pins, pads, traces, wires, terminals, leads, balls, screws, blades, or other contacts that enable formation of an electrical connection.

Figure 1B:
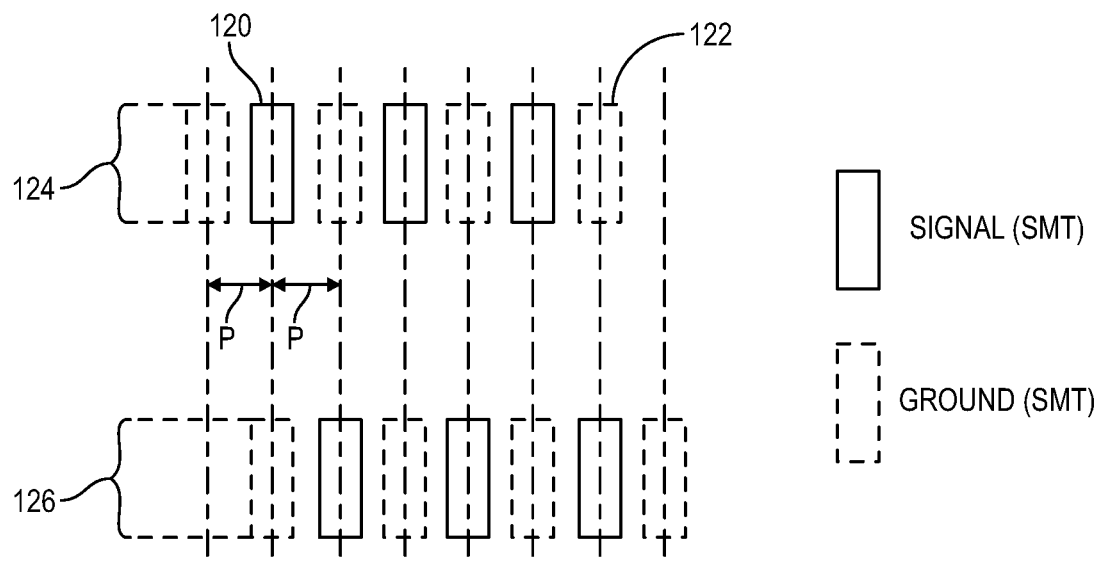
FIG. 1B illustrates an example of a footprint of a surface-mounted connector on a motherboard.

FIG. 1B illustrates an example of a footprint of a surface-mounted connector on a motherboard. The example in FIG. 1B illustrates the footprint of a 1:1 signal/ground ratio DDR5 (Double Data Rate version 5, JEDEC Standard JESD79-5) pinout. Thus, the example in FIG. 1B shows the footprint for two rows 124 and 126 of pins. Each row 124 and 126 shows alternating signal contacts 120 and ground contacts 122. Signal pins couple with the signal contacts 120. Ground pins couple with the ground contacts. The signal pins of the SMT connector are shielded by the ground pins, which limits crosstalk between signal pins and improves performance.

Thus, surface-mounting typically results in superior performance relative to through-hole mounting. However, surface-mounting techniques can be expensive and experience reliability issues. Typically, the SMT connector itself is more expensive than a plated through hole connector. Additionally, reflow is typically used in assembly of SMT connectors on the motherboard. Coplanarity of the connector (especially if the connector is very long) can cause soldering issues at high temperatures. The SMT terminal is not visible, and therefore difficult to inspect; therefore, techniques such as X-ray may be needed for inspection of SMT terminals. Furthermore, if the solder joint has an issue, the whole connector typically needs to be removed for rework. Overall, surface mounted components typically introduce more cost for both the component and manufacturing.

Figure 2A:
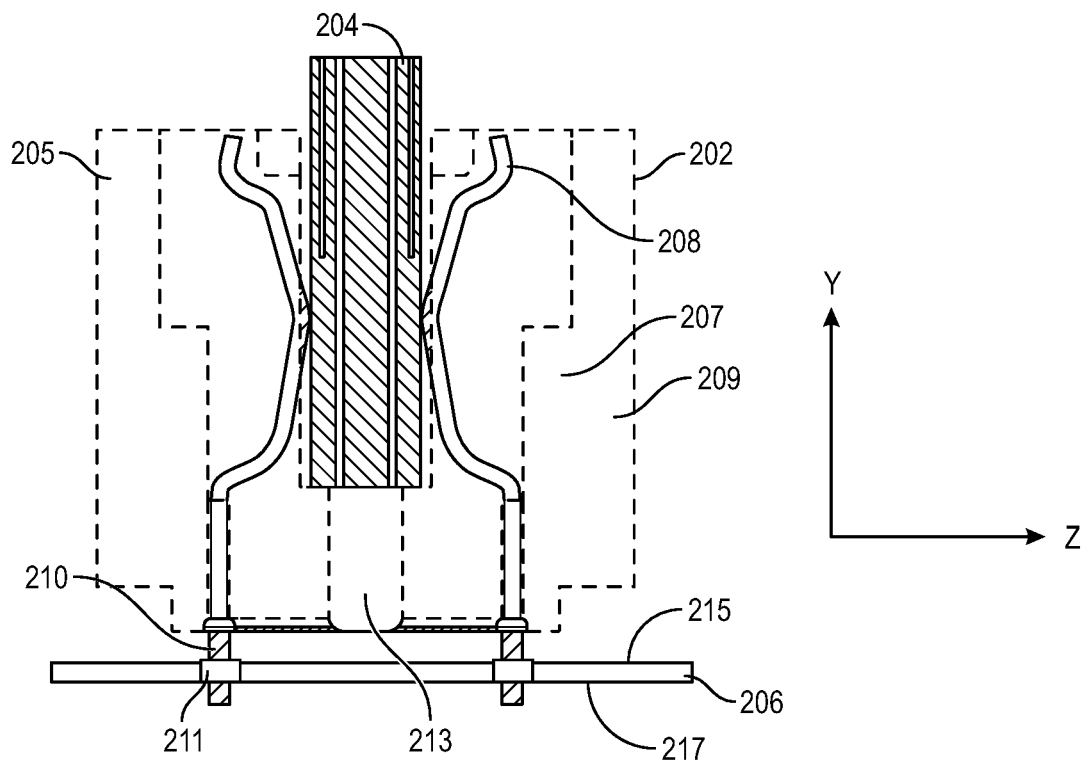
FIG. 2A is a cross-sectional view of an example of a module coupled with a motherboard via a through hole connector.

FIG. 2A is a cross-sectional view of an example of a module coupled with a motherboard via a through hole connector. The connector 202 couples a card or module 204 with a printed circuit board (PCB) such as a motherboard 206. Note that the following descriptions may refer specifically to a connector coupled with a motherboard as an example, but the examples are applicable to any connector or other component having a plurality of pins coupled with a PCB. One example of a connector is a memory module connector (e.g., DIMM connector). Examples of memory module connectors include UDIMM (unregistered DIMM) connectors, RDIMM (registered DIMM) connectors, or other DIMM connectors. Some DIMM connectors enable the DIMM to be vertically inserted into the connector mounted on a motherboard. However, hybrid pitch connectors could have a variety of orientations. For example, right angle connectors enable the DIMM to be inserted into the connector in a direction parallel to the motherboard. Memory module connectors may be compliant with a standard, such as DDR4, DDR5, or other memory standard.

The connector 202 includes pins 208 in a connector housing 209. The connector housing 209 is typically formed from a nonconductive (electrically insulating) material such as plastic. The connector housing provides the mechanical structure and support for the pins 208 and includes the slot or socket 213 for receiving the module 204. In the illustrated example, the module 204 can be vertically inserted into the slot 213 and vertically removed from the slot (where vertically in this example refers to perpendicular to the motherboard 206). Vertically inserting the module 204 into the slot 213 of the connector 202 causes conductive contacts on the module 204 to come into alignment and physical contact with the pins 208 of the connector 202. To enable electrical coupling with the contacts on the module, at least a portion of the module-facing ends of the pins are exposed in the slot. The pins 208 are in rows on each side of the connector slot 213. For example, there is a row of pins 208 on a first side 205 and another row of pins 208 on a second side 207.

Unlike the surface-mounted connector 102 of FIG. 1A, the connector 202 of FIG. 2A is mounted with through-hole technology. The motherboard 206 includes through-holes (also known as vias) 211 through the layers of the motherboard 206. Typically, through-holes 211 are formed in the motherboard by drilling through all the layers of the motherboard 206 to form a hole or via that passes completely through the motherboard 206. The through-holes 211 can be plated or non-plated. Plated through-holes (PTH) include a layer of a conductive material on the walls of the holes. Plated through-holes can also include a layer of conductive material surrounding the through-hole on the top surface and bottom surface of the motherboard. The top surface 215 of the motherboard is typically the surface upon which components are installed. The bottom surface 217 of the motherboard is opposite the top surface 215. In one example, the conductive material plating the through holes includes a metal such as gold, copper, and or another conductive metal.

In through-hole technology, the component to be coupled with the PCB has leads or terminals that pass through the through-holes. In the example in FIG. 2A, the pins 208 of the connector 202 include ends 210 that are external from the housing 209 that pass through the through-holes 211. The ends 210 of the pins 208 can then be secured and electrically coupled to contacts and/or traces on the motherboard 206 via solder. For example, solder can be applied in the through-hole, around the leads 210, and/or on the surfaces 215 and 217 of the motherboard 206 at the through-holes. The plating of plated through-holes can enable the leads to electrically couple with traces in one or more layers of the motherboard 206.

Figure 2B:
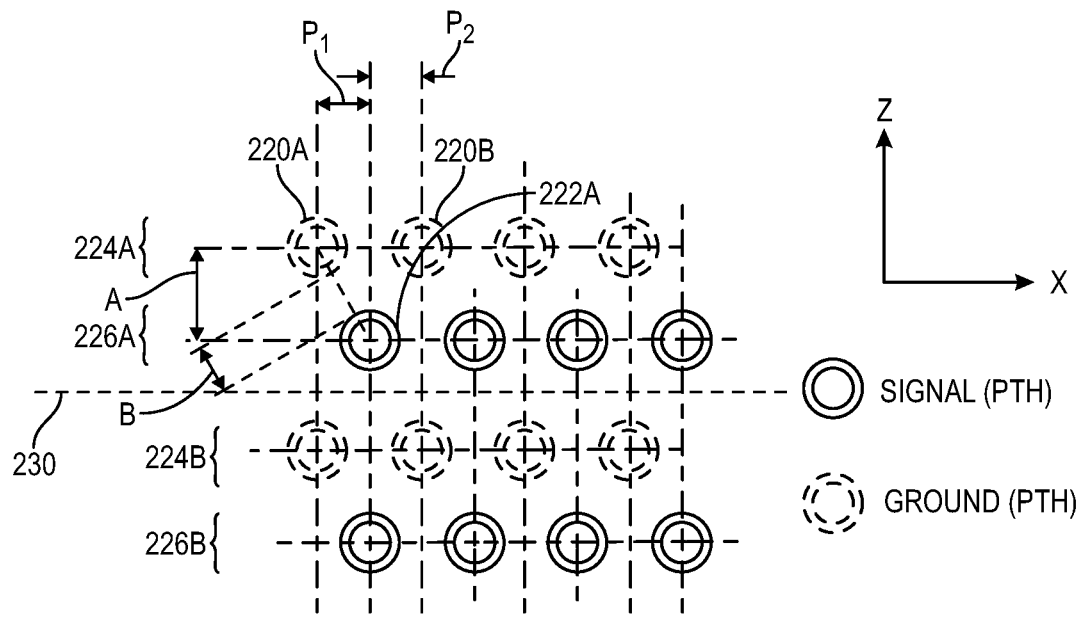
FIG. 2B illustrates an example of a footprint of a conventional through-hole connector on a motherboard.

FIG. 2B illustrates an example of a footprint of a conventional through-hole connector on a motherboard. The example footprint in FIG. 2B is for a conventional plated through hole (PTH) DDR4 (Double Data Rate, version 4, initial specification published in September 2012 by JEDEC) connector. The footprint in FIG. 2B shows through holes for ground pins (e.g., the rows 224A and 224B of ground through holes) and through holes for signal pins (e.g., the rows 226A and 226B of signal through holes). In the illustrated example, there is a row of signal through holes and ground through holes on each side of the connector slot. For example, a connector slot to receive a module or card may be located along the dotted line 230, with rows of through holes on either side of the slot.

The signal pins in FIG. 2B are offset (e.g., in the Z direction) from the ground pins at the motherboard-facing side of the connector. Thus, the through holes for the signal pins are in one row (see, e.g., 224A) and the through holes for the ground pins are in a second row (see, e.g., 226A) that is parallel to the first row. In addition to being in separate rows, the signal pin through-holes are offset from the ground pin through-holes 220 in the X direction to accommodate the alternating signal and ground pins.

Although the pins are not illustrated in FIG. 2B, the pin pitch is shown relative to the location of the through holes. The pitch of pins in a row is the distance between adjacent pins along an axis of the row. The pitch is typically measured from mid-points of the pins. In the conventional through hole connector of FIG. 2B, the pitch of the connector pins at the module-facing end have a consistent pitch of P1=P2, where P1 is the pitch between a signal pin and an adjacent ground pin, and P2 is the pitch between the signal pin and the next or other adjacent ground pin. For example, referring to FIG. 2B, P1 is the pitch between the signal pin to couple with through hole 222A and one adjacent ground pin (the ground pin to couple with the through hole 220A). P2 is the pitch between the signal pin and the other adjacent ground pin (the ground pin to couple with the through hole 220B). The pitch of pins on a connector is often determined based on a standard pitch set by a standards organization (e.g., a standard DIMM pin pitch such as 0.85 mm or other expected pin pitch). In the conventional through hole connector of FIG. 2B, the pitch P1 is the same as the pitch P2 at both the module-facing end and the motherboard-facing end of the pins.

In the example of FIG. 2B, the dimension B (the distance between the signal pin and an adjacent ground pin) needs to be large enough to enable sufficient space for routing. The dimension B drives the dimension A (the distance between a signal pin and an adjacent ground pin along the Z axis) to be larger, which separates the ground row (e.g., row 224A) and the signal row (e.g., 224B). The via effect causes crosstalk in through-hole connectors, and the more space between the ground vias and the signal vias, the more crosstalk between signal vias.

In one example, a connector with hybrid pitch has the benefits of through hole connectors with less crosstalk than conventional through hole connectors.

Figure 3:
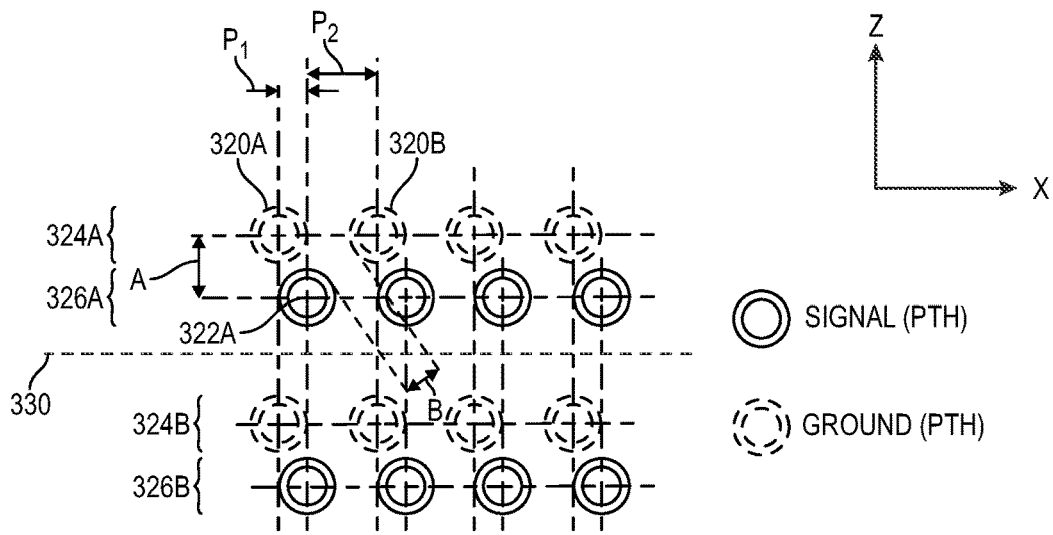
FIG. 3 is an example of a footprint of a through-hole connector with a hybrid pin pitch.

FIG. 3 is an example of a footprint of a through-hole connector with a hybrid pitch. For example, the footprint of FIG. 3 shows the location and position of through holes on a motherboard. For example, referring to FIG. 2A, the through holes 211 could have the footprint on the motherboard 206 as shown in FIG. 3. Turning again to FIG. 3, the through holes include rows 326A and 326B of signal through holes. Signal through holes are through holes for coupling with signal pins. Signal pins include pins for transmission of a signal, such as a data signal (e.g., data bus signal (DQ), command and address bus signal (CA), or other I/O signal). The through holes also include rows 324A and 324B of ground through holes. The ground through holes are through holes for coupling with ground or grounding pins. In the illustrated example, the through holes of a given row are evenly spaced. For example, the row 324A of ground through holes are evenly spaced with the same distance between each adjacent pair of ground through holes. Similarly, the row 326A of signal through holes are evenly spaced with the same distance between each adjacent pair of signal through holes. In the illustrated example, the row of signal through holes and the row of ground through holes have the same spacing. Other examples may include through holes that are not evenly spaced for the entire row.

Unlike the footprint of the connector shown in FIG. 2B in which the pin pitch is the same (P1=P2) at the motherboard side, the example in FIG. 3 shows a connector with a hybrid pitch where P1 is not equal to P2. The connector footprint of FIG. 3 has a row of signal through holes and a row of ground through holes on each side of the connector slot. For example, a connector slot (such as the slot 213 of FIG. 2A) for receiving a module or card may be located between the pairs of through-hole rows at the dotted line 330. Thus, the rows 324A and 326A are located on one side of the connector slot and the rows 324B and 326B are located on the other side of the connector slot. Referring to FIG. 2A, the rows 324A and 326A of through holes are in the motherboard 206 on one side 205, and the rows 324B and 326B are in the motherboard 206 on the other side 207 of the slot 213. For perspective, if a module is vertically inserted (e.g., in a direction into the page along dotted line 330 of FIG. 3) into a connector having a footprint as in FIG. 3, the connector pins along rows 324A and 326A would couple with contacts on one face of the module, and the connector pins along rows 324B and 326B would couple with contacts on the opposite face of the module. Thus, although the pins at the motherboard end are offset from one another in the Z direction, the pins on the module-facing end are not offset in the Z direction in order to couple with the contacts on the module.

In the example illustrated in FIG. 3, for each signal through hole that has two adjacent ground through holes, the signal through hole is closer to one adjacent ground through hole than a second adjacent ground through hole. Similarly, for each ground through hole that has two adjacent signal through holes, the ground through hole is closer to one adjacent signal through hole than a second adjacent signal through hole. Note that some through holes will be at the end of the row and therefore may have only one adjacent through hole. There is a nonuniform or hybrid pitch between a signal pin and the two adjacent ground pins at the motherboard-facing end of the pins (referred to as the leads of the pins).

The hybrid pitch of the leads can enable a reduction in crosstalk by bringing each signal via closer to a ground via. In the illustrated example, pitch P1 is less than pitch P2 of the leads of the pins that couple with the through holes in the motherboard. As mentioned above, the pins still have a consistent pitch at the module-facing end to enable coupling with standardized modules. Thus, the pitch between module-facing ends of the pins is different than the pitch at the motherboard-facing end. For example, the pitch P1 between the lead of a signal pin to couple with the through hole 322A and the lead of one adjacent ground pin (the ground pin to couple with the through hole 320A) is less than the pitch P2 between the lead of the signal pin and the lead of the other adjacent ground pin (the ground pin to couple with the through hole 320B). Considering an example in which a connector is to couple with and accept a module such as a DIMM, the pitch at the DIMM-facing end of the pins would be the same (e.g., P1=P2=0.85 mm) and the pitch of leads at the motherboard-facing side would be different between each adjacent pair (e.g., P1=0.5 mm and P2=1.2 mm, or some other pitch where P1<P2).

Due to the smaller pitch P1, the signal vias are closer to the ground vias, which reduces crosstalk. Dimension A is reduced compared to conventional through-hole connectors to enable moving the signal via close to the ground via, while still maintaining enough space (dimension B) for routing. In conventional connectors with a non-hybrid pitch, when you reduce dimension A, dimension B is also reduced; as mentioned above, the dimension B in conventional connectors needs to be large enough to enable sufficient space for routing. In a connector with a hybrid pitch such as illustrated in FIG. 3, shifting the signal through holes to be closer to a ground through hole enables a reduction in dimension A without compromising the area for routing. By shifting the signal through holes closer to the ground through holes, the crosstalk can be significantly reduced. The reduction in crosstalk enables achieving a similar signal integrity performance as SMT connectors. In addition to reduced crosstalk, a connector with hybrid pitch can provide easier manufacturing (with an offset PTH lead), easier implementation on the motherboard, and cost savings compared to SMT connectors.

Figure 4:
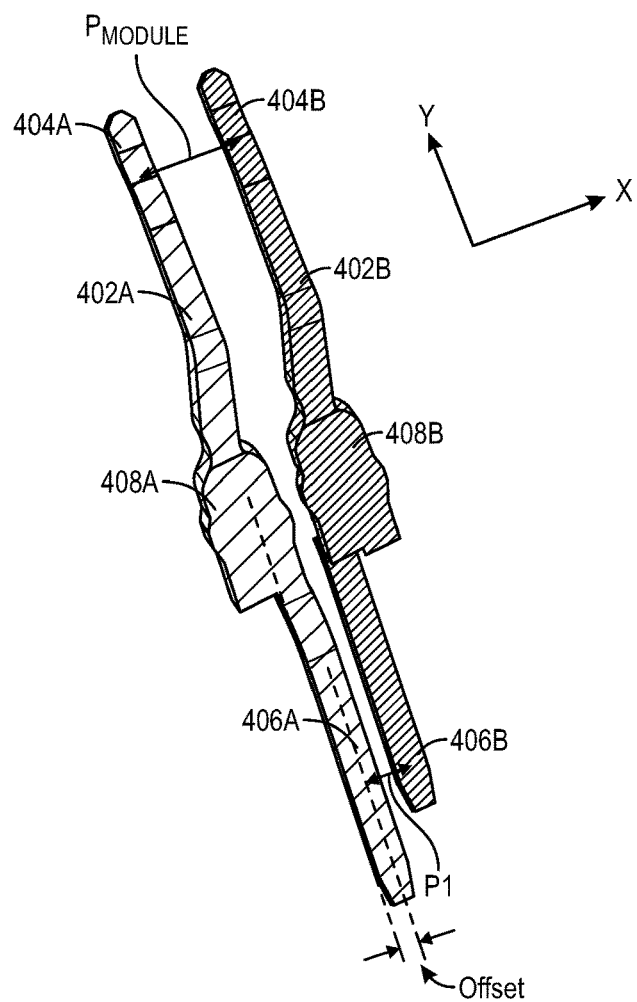
FIG. 4 illustrates an example of a pair of pins with offset leads.

As mentioned above, the module (such as a DIMM) mated with a connector has a fixed pitch. In order to support a hybrid pitch footprint, the leads of the connector pins have an offset. FIG. 4 illustrates an example of a pair of pins with offset leads. FIG. 4 illustrates two adjacent pins 402A and 402B. One pin is a ground pin 402A and the other pin is a signal pin 402B. Each of the pins has a card-facing or module-facing end to couple with a card or module and a motherboard-facing end (which could also be referred to as the PCB-facing end, lead, or terminal). For example, the pin 402A has one end 404A for coupling with contacts on a module and an opposite end 406A for coupling with contacts on a motherboard. Similarly, the pin 402B has one end 404B for coupling with contacts on a module and an opposite end 406B for coupling with contacts on a motherboard. The pins include one or more conductive materials such as metal (e.g., gold, copper, and or another conductive metal). The ends of the pins illustrated in FIG. 4 have an elongated oblong shape projecting or extending away from a center portion and may be referred to as "fingers" or "golden fingers" referring to the pin ends that include gold (e.g., gold-containing and/or gold-plated pins).

The ends 404A and 404B on the module-side have a consistent pitch $P_{module}$ (and therefore also having a consistent spacing or distance between pins) to enable coupling with a module. Thus, the module-facing ends of the pins 402A and 402B are aligned in a row and consistently spaced along the axis of the row (e.g., along the x-axis in FIG. 4). The consistent spacing along the axis of the row enables the pin ends to make physical contact with the module and line up with contacts on the module. The module-facing ends of the pins 402A and 402B have no offset in a direction perpendicular to the plane of the module (e.g., in FIG. 4, the module-facing ends of the pins have no offset in a z direction coming out of or going into the page).

A middle portion of the pins 402A and 402B may be referred to as a barb or retention barb to aid in retention (e.g., physically securing and stabilizing) the pins in the connector housing. For example, the pin 402A has a middle portion 408A and the pin 402B has a middle portion 408B. The middle portions 408A and 408B may have a variety of shapes and sizes. In the example of FIG. 4, the middle portions have a flat or planar portion that is substantially parallel to the plane of the module with which the pins are to couple. Thus, the adjacent pins 402A and 402B are the same with no offsets at the middle portion and module-facing ends (e.g., no offsets in a direction perpendicular to the plane of the module or middle portion).

However, in contrast to conventional connector pins, the leads of adjacent pins have offsets in both a direction orthogonal to the plane of the module and in a direction along the axis of the row of pins. The offset in a direction orthogonal to the plane of the module is shown in FIG. 3 as the distance "A" and would be along a z-axis in FIG. 4 (e.g., in a direction into or out of the page). The offset in the direction orthogonal to the plane of the module causes the leads and through-holes to be in two rows, as shown in FIG. 3 (e.g., row 324A for ground through-holes and row 326A for signal through-holes).

In addition to the offset in a direction orthogonal to the module, one or both pins are offset in a direction along the axis of the row of pins to cause a signal pin lead to be closer to a ground pin lead. In FIG. 4, this additional offset along the x-axis is labeled as "offset." The offset causes the pitch between a signal pin and an adjacent ground pin at the motherboard side to be smaller than the pitch Pmodule at the module side. For example, the pitch between the leads of pin 402A and pin 402B is P1 (see, e.g., pitch P1 of FIG. 3). In the example of FIG. 4, the midpoint of the lead 406A is offset from the midpoint of the middle section 408A. The midpoint of the lead 406A is also offset from the midpoint of the module-facing end 404A of the ground pin 402A. The offset causes the lead 406A of the ground pin 402A to be closer to the lead 406B of the adjacent signal pin 402B. One or both pins can have an offset. For example, only the lead of the ground pin can be offset, only the lead of the signal pin can be offset, or both the leads of the ground and signal pins can be offset (where the offset referred to is along the axis of the row of pins in the x-direction).

If another pair of signal and ground pins were shown next to pins 402A and 402B, then the pitch between the lead of pin 402B and the other adjacent ground pin would be larger (e.g., P2) than the pitch Pmodule at the module-facing end. Thus, the pitch between the lead of a signal pin and the lead of one adjacent ground pin is different than the pitch between the lead of the signal pin and the lead of the other adjacent ground pin.

Figure 5:
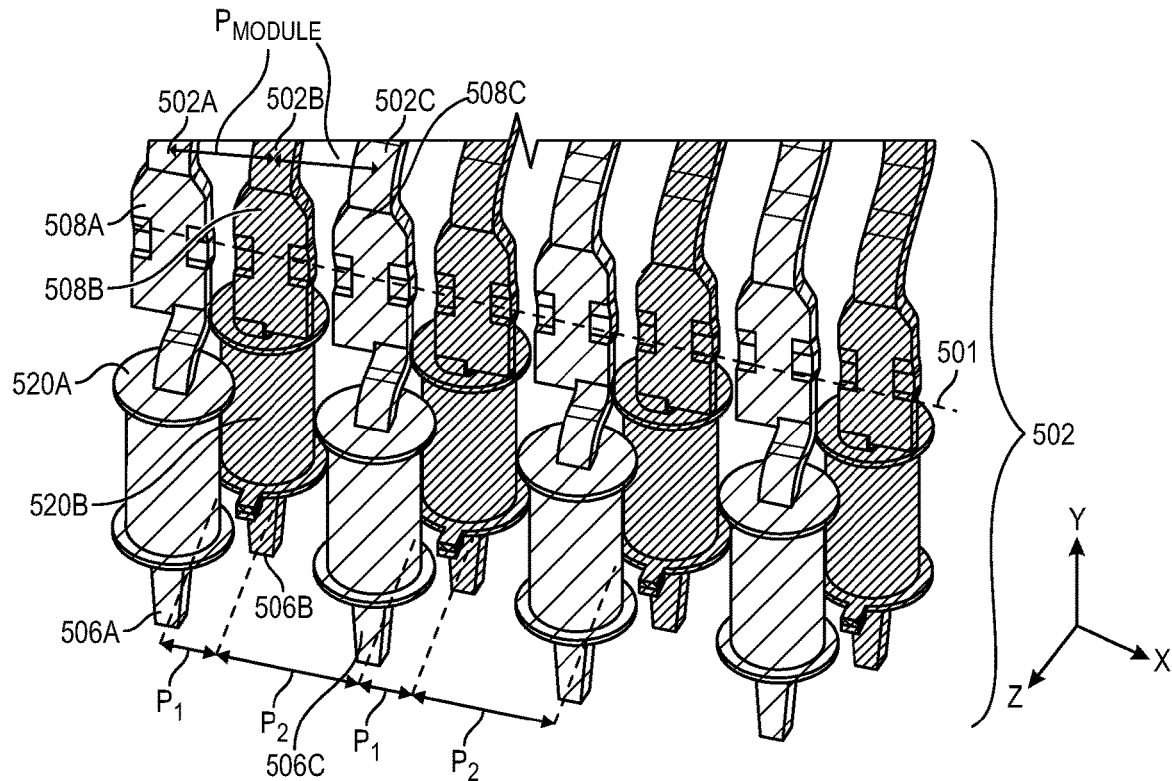
FIG. 5 shows a three-dimensional perspective of an example of a plurality of pins.
Figure 6:
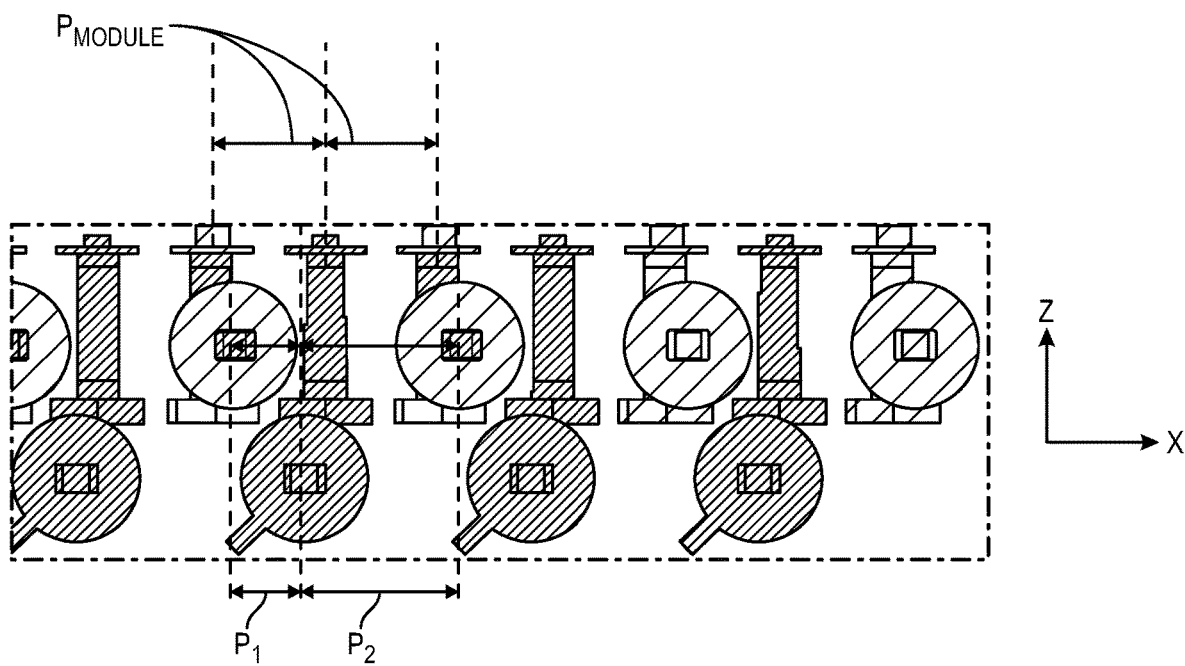
FIG. 6 illustrates a bottom up view of an example of connector pins with a hybrid pitch.

FIGS. 5 and 6 illustrate different views of an example of a row of connector pins with offset leads coupled with through holes. FIG. 5 shows a three-dimensional perspective of a plurality of pins 502 in a row along an axis 501 (the x-axis in FIG. 5). The leads of the pins are shown as inserted into through holes on the motherboard (e.g., through holes 520A and 520B). The plurality of pins 502 includes alternating or interleaved signal pins and ground pins. For example, the signal pin 502B is between two adjacent ground pins 502A and 502C. The connector pins in FIG. 5 have a hybrid or offset pitch at the motherboard side. For example, a first pitch P1 between the lead 506B of pin 502B and the lead 506A of an adjacent pin 502A is different than a second pitch P2 between the lead 506B and the lead 506C of a second adjacent pin 502C. In the illustrated example, the pitch between leads of a signal pin and one adjacent ground pin is less than the pitch between the leads of the signal pin and the other adjacent ground pin. Thus, the lead of the signal pin (e.g., the pin 502B) is closer to the lead of one adjacent ground pin than the other adjacent ground pin. In one example, the offset at the pin leads results in an alternating pitch. For example, the pitch of the leads alternates between the first pitch P1 and the second pitch P2 between each adjacent pair of pins (e.g., the pitch of the leads of adjacent pairs of connector pins is P1, P2, P1, P2, and so forth).

In one example, the ends of the pins that connect with the module have a consistent pitch (e.g., a third pitch, labeled Pmodule) that is different than the pitches of the leads of the connector pins. A portion of the module-facing ends of the pins 502 are shown in FIG. 5. As can be seen in FIG. 5, the pitch Pmodule of the module-facing ends is the same for each adjacent pair of pins. As illustrated in FIG. 5, the first pitch P1 is less than the third pitch (Pmodule) of the card or module-facing ends of the plurality of pins. The second pitch P2 is greater than the third pitch (Pmodule).

Each of the plurality of pins also includes a middle section between the leads and the module-facing ends of the pins. For example, the pin 502A has a middle section 508A between the lead 506A and the module-facing end of the pin. The pin 502B has a middle section 508B between the lead 506B and the module-facing end of the pin; and the pin 502C has a middle section 508C between the lead 506C and the module-facing end of the pin. In one example, the pitch of the middle sections of the plurality of pins is the same for the plurality of pins (e.g., same between adjacent pairs of pins). In one example, the pitch of the middle sections of the pins is the same as the pitch of the module-facing ends of the pins.

Referring again to the leads of the connector pins, the alternating pitch of the leads can be achieved by one or more of the leads being offset in a direction along an axis of the row. Note that this offset is different than (and in the illustrated example, in addition to), an offset in a direction orthogonal to the plane of the card or module (e.g., the offset along the z-axis). The offset along the z-axis results in the leads of the signal pins being in one row for coupling with the row of signal through holes, and the leads of the ground pins being in a second row for coupling with the row of ground through holes.

In the example illustrated in FIG. 5, in addition to the offset along the z-axis, the leads are offset along the x-axis relative to the module-facing end of the pin. For example, a midpoint of the lead of the pin is offset relative to a midpoint of the card or module-facing end of the pin in a direction along the axis 501 of the row of pins 502. To achieve the offset, the leads of every other pin can be offset. For example, the leads of every ground pin or the leads of every signal pin can be offset along the axis of the row of pins. In another example, the leads of every pin can be offset along the axis of the row of pins. For example, the leads of both the pin 502A and 502B can be offset along the axis of the row to be closer to one another. In one such example, the pairs of pins both have leads that are offset to be closer to one another.

Although only one partial row of pins is shown in FIG. 5, typically a connector has pins on both sides of the slot for receiving the module to make electrical contact with the pads on both faces of the module. Thus, there are typically a first and second plurality of pins and a slot between the first and second plurality of pins to receive the card or module. For example, referring to FIG. 2A, there is a slot 213 between a row of pins on the side 205 and a second row of pins on the side 207. In one such example, the leads of the second plurality of pins on one side have the same pitch as the leads of the first plurality of pins on the other side.

Thus, FIG. 5 shows a row of pins including alternating signal pins and ground pins. Each of the signal pins includes a lead to couple with one of the signal through holes in the motherboard and each of the ground pins includes a lead to couple with one of the ground through holes in the motherboard. The first pitch P1 between leads of a pin and a first adjacent pin is different than a second pitch P2 between leads of the pin and a second adjacent pin.

FIG. 6 illustrates a bottom up view of an example of connector pins with a hybrid pitch. FIG. 6 shows one row of pins coupled with two row of plated through holes. The fingers at the module-end of the pins have the consistent pitch of Pmodule, and the leads at the motherboard-end of the pins have a hybrid pitch where P1 is not equal to P2. The hybrid pitch enables the signal pins to be closer to a ground through hole, which can lead to reduced crosstalk and higher performance. Connectors with a hybrid pitch such as those described herein can be implemented for a variety of applications, such as memory modules (e.g., DIMMs) or other cards or modules (e.g., accelerators or other card-mounted devices or processors).

Figure 7:
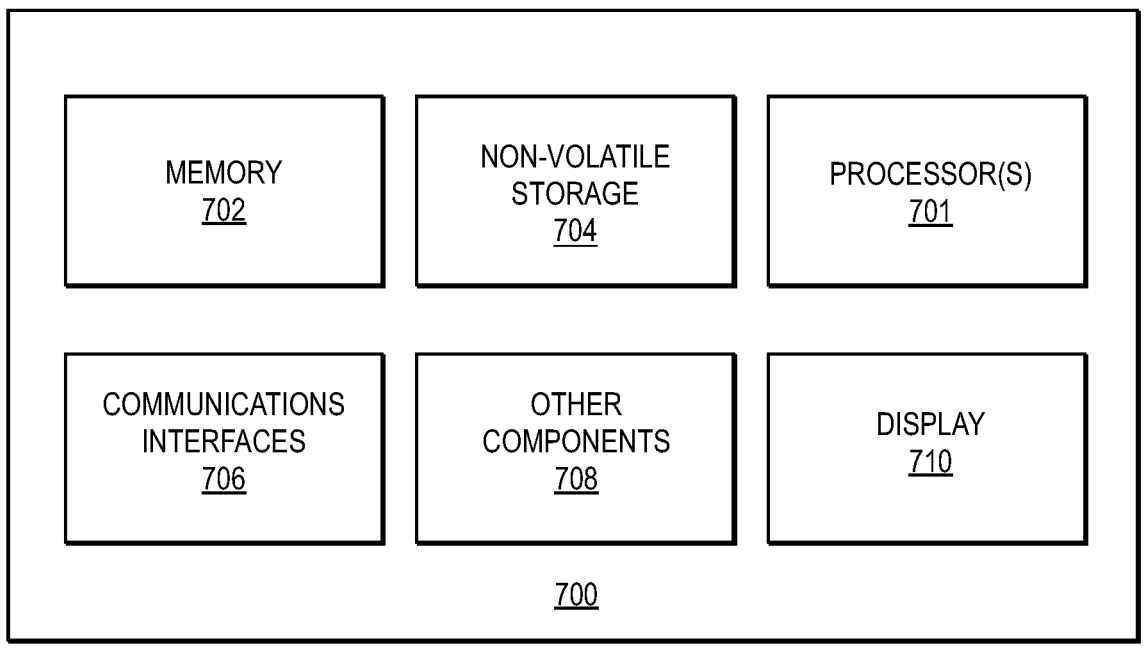
FIG. 7 provides an exemplary depiction of a computing system that . . . described herein.

FIG. 7 provides an exemplary depiction of a computing system 700 in which a hybrid pitch connector can be implemented. The computing system 700 can be, for example, user equipment, a computer, a personal computer (PC), a desktop computer, a laptop computer, a notebook computer, a netbook computer, a tablet, a smart phone, embedded electronics, a gaming console, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. The system 700 may include a motherboard onto which components may be mounted. As observed in FIG. 7, the system 700 includes one or more processors or processing units 701 (e.g., host processor(s)). The processor(s) 701 may include one or more central processing units (CPUs), each of which may include, e.g., a plurality of general-purpose processing cores. The processor(s) 701 may also or alternatively include one or more graphics processing units (GPUs) or other processing units. The processor(s) 701 may include memory management logic (e.g., a memory controller) and I/O control logic. The processor(s) 701 typically include cache on a same package or near the processor.

The system 700 also includes memory 702 (e.g., system memory). The system memory can be in the same package (e.g., same SoC) or separate from the processor(s) 701. The system 700 can include static random-access memory (SRAM), dynamic random-access memory (DRAM), or both. In some examples, memory 702 may include volatile types of memory including, but not limited to, RAM, D-RAM, DDR SDRAM, SRAM, T-RAM or Z-RAM. One example of volatile memory includes DRAM, or some variant such as SDRAM. Memory as described herein may be compatible with a number of memory technologies, such as DDR4 (Double Data Rate (DDR) version 4, JESD79-4, initial specification published in September 2012 by JEDEC), LPDDR4 (LOW POWER DOUBLE DATA RATE (LPDDR) version 4, JESD209-4, originally published by JEDEC in August 2014), LPDDR5 (LPDDR version 5, JESD209-5, originally published by JEDEC in February 2019), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, JESD79-5 initial specification published in July 2020 by JEDEC), LPDDR5 (LPDDR version 5, currently in discussion by JEDEC), HBM2 (HBM version 2, currently in discussion by JEDEC), and/or others, and technologies based on derivatives or extensions of such specifications. In one example, the memory 702 includes a byte addressable DRAM or a byte addressable non-volatile memory such as a byte-addressable write-in-place three dimensional crospoint memory device, or other byte addressable write-in-place non-volatile memory devices (also referred to as persistent memory), such as single or multi-level Phase Change Memory (PCM) or phase change memory with a switch (PCMS), NVM devices that use chalcogenide phase change material, resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory may be packaged as one or more DIMMs to be inserted into a connectors as described herein.

The system 700 also includes communications interfaces 706, a display (e.g., touchscreen, flat-panel) 710, and other components 708. The other components may include, for example, a power supply (e.g., a battery or/or other power supply), sensors, power management logic, or other components. The communications interfaces 706 may include logic and/or features to support a communication interface. For these examples, communications interface 706 may include one or more input/output (I/O) interfaces that operate according to various communication protocols or standards to communicate over direct or network communication links or channels. Direct communications may occur via use of communication protocols or standards described in one or more industry standards (including progenies and variants). For example, I/O interfaces can be arranged as a Serial Advanced Technology Attachment (SATA) interface to couple elements of a node to a storage device. In another example, I/O interfaces can be arranged as a Serial Attached Small Computer System Interface (SCSI) (or simply SAS), Peripheral Component Interconnect Express (PCIe), or Non-Volatile Memory Express (NVMe) interface a storage device with other elements of a node (e.g., a controller, or other element of a node). Such communication protocols may be utilized to communicate through I/O interfaces as described in industry standards or specifications (including progenies or variants) such as the Peripheral Component Interconnect (PCI) Express Base Specification, revision 3.1, published in November 2014 ("PCI Express specification" or "PCIe specification") or later revisions, and/or the Non-Volatile Memory Express (NVMe) Specification, revision 1.2, also published in November 2014 ("NVMe specification") or later revisions. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system 700 also includes non-volatile storage 704, which may be the mass storage component of the system. Non-volatile types of memory may include byte or block addressable non-volatile memory such as, but not limited to, NAND flash memory (e.g., multi-threshold level NAND), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), three-dimensional (3D) cross-point memory structure that includes a chalcogenide material and/or a phase change material hereinafter referred to as "3D cross-point memory", or a combination of any of the above. For these examples, storage 704 may be arranged or configured as a solid-state drive (SSD). The data may be read and written in blocks and a mapping or location information for the blocks may be kept in memory 702.

The computing system 700 may also include one or more accelerators or other computing devices. For example, the computing system 700 may include an Artificial Intelligence (AI) or machine learning accelerator optimized for performing operations for machine learning algorithms, a graphics accelerator (e.g., GPU), or other type of accelerator. An accelerator can include processing circuitry (analog, digital, or both) and may also include memory within the same package as the accelerator. Accelerators may be mounted on cards to be inserted into connectors such as the connectors described herein.

Examples of hybrid pitch through hole connectors follow.

Example 1: A connector to couple a card or module to a motherboard, the connector including: connector housing and a plurality of pins including alternating signal and ground pins. Each of the plurality of pins includes a card or module-facing end to couple with the card or module and a lead to couple with a through hole in the motherboard. A first pitch between leads of a pin and a first adjacent pin is different than a second pitch between leads of the pin and a second adjacent pin.

Example 2: A connector in accordance with example 1, wherein: leads of a signal pin and a first adjacent ground pin have the first pitch and leads of the signal pin and a second adjacent ground pin have the second pitch.

Example 3: A connector in accordance with one or more of examples 1 and 2, wherein: pitch of leads of the plurality of pins alternates between the first pitch and the second pitch between each adjacent pair of pins.

Example 4: A connector in accordance with one or more of examples 1, 2, and 3, wherein: a third pitch of the card or module-facing ends of the plurality of pins is the same for each adjacent pair of the plurality of pins.

Example 5: A connector of in accordance with one or more of examples 1, 2, 3, and 4, wherein the first pitch is less than the third pitch of the card or module-facing ends of the plurality of pins, and the second pitch is greater than the third pitch of the card or module-facing ends of the plurality of pins.

Example 6: A connector in accordance with one or more of examples 1, 2, 3, 4, and 5, wherein: each of the plurality of pins includes a middle section, and wherein pitch of middle sections of the plurality of pins is the same between adjacent pairs of pins.

Example 7: A connector in accordance with one or more of examples 1, 2, 3, 4, 5, and 6, wherein: the plurality of pins are in a row in the connector housing, and the lead of the pin is offset in a direction along an axis of the row relative to the card or module-facing end of the pin.

Example 8: A connector in accordance with one or more of examples 1, 2, 3, 4, 5, 6, and 7, wherein: a midpoint of the lead of the pin is offset relative to a midpoint of the card or module-facing end of the pin in a direction along the axis of the row.

Example 9: A connector in accordance with one or more of examples 1, 2, 3, 4, 5, 6, 7, and 8, wherein: the lead of every other pin of the plurality of pins is offset in a direction along the axis of the row relative to its card or module-facing end.

Example 10: A connector in accordance with one or more of examples 1, 2, 3, 4, 5, 6, 7, 8, and 9, wherein: the lead of each of the plurality of pins is offset in a direction along the axis of the row relative to its card or module-facing end.

Example 11: A connector in accordance with one or more of examples 1, 2, 3, 4, 5, 6, 7, 8, 9, and 10, wherein: the lead of every other pin of the plurality is offset in a direction orthogonal to the plane of the card or module.

Example 12: A connector in accordance with one or more of examples 1, 2, 3, 4, 5, 6, 7, 8, 9, 10, and 11, further including a second plurality of pins opposite the plurality of pins, and a slot between the plurality of pins and the second plurality of pins to receive the card or module.

Example 13: A connector in accordance with one or more of examples 1, 2, 3, 4, 5, 6, 7, 8, 9, 10, 11, and 12, wherein: leads of the second plurality of pins have the same pitch as leads of the plurality of pins.

Example 14: A dual inline memory module (DIMM) connector including: connector housing, and a plurality of pins including alternating signal and ground pins. Each of the plurality of pins including a DIMM-facing end to couple with a DIMM and a lead to couple with a plated through hole in a motherboard. A first pitch between leads of a pin and a first adjacent pin is different than a second pitch between leads of the pin and a second adjacent pin.

Example 15: A DIMM connector in accordance with one or more of examples 14 and 2-13.

Example 16: A system including a motherboard, the motherboard including a first row of ground plated through holes, and a second row of signal plated through holes parallel to the first row of ground plated through holes. Each of the signal plated through holes is closer to one adjacent ground plated through hole than a second adjacent ground plated through hole. The motherboard also include a connector coupled with the first row of ground plated through holes and the second row of signal plated through holes on the motherboard, the connector including a plurality of pins, wherein a first pitch between leads of a pin and a first adjacent pin is different than a second pitch between leads of the pin and a second adjacent pin. The connector may be in accordance with one or more of examples 2-13.

Example 17: A system in accordance with example 16, wherein: a first row of ground plated through holes are evenly spaced, and the second row of signal plated through holes are evenly spaced.

Example 18: A system in accordance with one or more of examples 16 and 17, wherein the plurality of pins including alternating signal pins and ground pins, each of the signal pins including a lead to couple with one of the signal plated through holes in the motherboard and each of the ground pins including a lead to couple with one of the ground plated through holes.

Example 19: A system in accordance with one or more of examples 16, 17, and 18, further including a dual inline memory module (DIMM) coupled with the connector.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A connector to couple a card or module to a motherboard, the connector comprising:
a connector housing; and
a plurality of pins including alternating signal and ground pins, signal pins included in a first row in the connector housing, ground pins included in a second row in the connector housing, each of the plurality of pins to include a card or module-facing end to couple with the card or module and a lead to couple with a through hole in the motherboard;
a first pitch between leads of a pin and a first adjacent pin is different than a second pitch between leads of the pin and a second adjacent pin, wherein leads of a signal pin and a first adjacent ground pin have the first pitch and leads of the signal pin and a second adjacent ground pin have the second pitch, and wherein the first and second adjacent ground pins are included in a same row in the connector housing.

2. The connector of claim 1, wherein:
pitch of leads of the plurality of pins alternates between the first pitch and the second pitch between each adjacent pair of pins.

3. The connector of claim 1, wherein:
a third pitch of the card or module-facing ends of the plurality of pins is the same for each adjacent pair of the plurality of pins.

4. The connector of claim 3, wherein:
the first pitch is less than the third pitch of the card or module-facing ends of the plurality of pins; and
the second pitch is greater than the third pitch of the card or module-facing ends of the plurality of pins.

5. The connector of claim 1, wherein:
each of the plurality of pins includes a middle section, wherein pitch of middle sections of the plurality of pins is the same between adjacent pairs of pins.

6. The connector of claim 1, wherein:
the lead of the pin is offset in a direction along an axis of a respective row that includes the pin relative to the card or module-facing end of the pin.

7. The connector of claim 6, wherein:
a midpoint of the lead of the pin is offset relative to a midpoint of the card or module-facing end of the pin in a direction along the axis of a respective row that includes the pin.

8. The connector of claim 6, wherein:
the lead of every other pin of the plurality of pins is offset in a direction along the axis of a respective row that includes the pin relative to its card or module-facing end.

9. The connector of claim 6, wherein:
the lead of each of the plurality of pins is offset in a direction along the axis of a respective row that includes the pin relative to its card or module-facing end.

10. The connector of claim 1, wherein:
the lead of every other pin of the plurality is offset in a direction orthogonal to a plane of the card or module.

11. The connector of claim 1, further comprising:
a second plurality of pins including alternating signal and ground pins, signal pins of the second plurality of pins included in a third row in the connector housing, ground pins of the second plurality of pins included in a fourth row in the connector housing; and
a slot between the plurality of pins and the second plurality of pins to receive the card or module.

12. The connector of claim 11, wherein:
leads of the second plurality of pins have the same pitch as leads of the plurality of pins.

13. A dual inline memory module (DIMM) connector comprising:
a connector housing; and
a plurality of pins including alternating signal and ground pins, signal pins included in a first row in the connector housing, ground pins included in a second row in the connector housing, each of the plurality of pins to include a DIMM-facing end to couple with a DIMM and a lead to couple with a plated through hole in a motherboard;
a first pitch between leads of a pin and a first adjacent pin is different than a second pitch between leads of the pin and a second adjacent pin, wherein leads of a signal pin and a first adjacent ground pin have the first pitch and leads of the signal pin and a second adjacent ground pin have the second pitch, and wherein the first and second adjacent ground pins are included in a same row in the connector housing.

14. The DIMM connector of claim 13, wherein:
a pitch of the DIMM-facing ends of the plurality of pins is the same between adjacent pairs of pins.

15. A system comprising:
a motherboard including:
a first row of ground plated through holes; and
a second row of signal plated through holes parallel to the first row of ground plated through holes, each of the signal plated through holes is closer to one adjacent ground plated through hole than a second adjacent ground plated through hole; and a connector coupled with the first row of ground plated through holes and the second row of signal plated through holes on the motherboard, the connector including:

a plurality of pins, wherein a first pitch between leads of a pin and a first adjacent pin is different than a second pitch between leads of the pin and a second adjacent pin, the plurality of pins including alternating signal pins and ground pins, each of the signal pins including a lead to couple with one of the signal plated through holes in the motherboard and each of the ground pins including a lead to couple with one of the ground plated through holes, wherein leads of a signal pin and a first adjacent ground pin have the first pitch and leads of the signal pin and a second adjacent ground pin have the second pitch, and wherein the first and second adjacent ground pins are included in a same row in a housing of the connector.

16. The system of claim 15, wherein:

a first row of ground plated through holes are evenly spaced; and the second row of signal plated through holes are evenly spaced.

17. The system of claim 15, further comprising:

a dual inline memory module (DIMM) coupled with the connector.

* * * * *